(12) United States Patent
Iwamoto

(10) Patent No.: US 10,917,069 B2
(45) Date of Patent: Feb. 9, 2021

(54) ELECTRONIC COMPONENT

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 740 days.

(21) Appl. No.: 15/701,550

(22) Filed: Sep. 12, 2017

(65) Prior Publication Data

US 2018/0026603 A1    Jan. 25, 2018

Related U.S. Application Data

(63) Continuation of application No. PCT/JP2016/059614, filed on Mar. 25, 2016.

(30) Foreign Application Priority Data

May 22, 2015  (JP) ................. 2015-104356

(51) Int. Cl.
*H03H 9/02* (2006.01)
*H01L 23/04* (2006.01)
(Continued)

(52) U.S. Cl.
CPC ......... *H03H 9/02133* (2013.01); *H01L 23/02* (2013.01); *H01L 23/04* (2013.01); *H01L 23/10* (2013.01); *H01L 23/3128* (2013.01); *H03H 3/02* (2013.01); *H03H 9/059* (2013.01); *H03H 9/0542* (2013.01); *H03H 9/0547* (2013.01);
(Continued)

(58) Field of Classification Search
CPC combination set(s) only.
See application file for complete search history.

(56) References Cited

U.S. PATENT DOCUMENTS

2007/0252481 A1* 11/2007 Iwamoto ............... H03H 9/72
                                                                        310/344
2009/0224851 A1    9/2009 Feiertag et al.
(Continued)

FOREIGN PATENT DOCUMENTS

EP    2 960 930 A1    12/2015
JP    09-153514 A     6/1997
(Continued)

OTHER PUBLICATIONS

English Translation of JP 5828406 (Year: 2014).*
(Continued)

*Primary Examiner* — Bryan P Gordon
(74) *Attorney, Agent, or Firm* — Keating & Bennett, LLP

(57) ABSTRACT

An electronic component includes a piezoelectric substrate, a functional electrode on the piezoelectric substrate, a support layer on the piezoelectric substrate, a cover layer on the support layer, the cover layer, the support layer, and the piezoelectric substrate defining a hollow space that the functional electrode faces, and connection terminals that are electrically connected to the functional electrode, that are each made from a metal particle aggregate, and that each have a porous structure. The connection terminals are each located at a position in which the connection terminals overlap at least a portion of the hollow space in plan view.

19 Claims, 8 Drawing Sheets

(51) Int. Cl.
*H01L 23/02* (2006.01)
*H03H 9/05* (2006.01)
*H03H 9/10* (2006.01)
*H01L 23/31* (2006.01)
*H03H 9/25* (2006.01)
*H01L 23/10* (2006.01)
*H03H 3/02* (2006.01)
*H03H 9/09* (2006.01)
*H01L 23/00* (2006.01)
*H01L 21/56* (2006.01)

(52) U.S. Cl.
CPC ............ *H03H 9/09* (2013.01); *H03H 9/1014* (2013.01); *H03H 9/1057* (2013.01); *H03H 9/1071* (2013.01); *H03H 9/1085* (2013.01); *H03H 9/25* (2013.01); *H01L 21/568* (2013.01); *H01L 23/562* (2013.01)

(56) References Cited

U.S. PATENT DOCUMENTS

| | | | | |
|---|---|---|---|---|
| 2010/0289600 A1* | 11/2010 | Takada | ............... | H03H 3/00 333/193 |
| 2011/0084573 A1* | 4/2011 | Yamaji | ............... | H03H 9/1092 310/340 |
| 2011/0115086 A1* | 5/2011 | Liu | ............... | H01L 29/66742 257/741 |
| 2012/0280768 A1* | 11/2012 | Nakayama | ........... | H03H 9/0576 333/193 |
| 2014/0131853 A1* | 5/2014 | Takemura | ............ | H03H 9/0542 257/734 |
| 2016/0261038 A1* | 9/2016 | Tanaka | ............... | H03H 9/6456 |

FOREIGN PATENT DOCUMENTS

| | | |
|---|---|---|
| JP | 2006-128158 A | 5/2006 |
| JP | 2009-247012 A | 10/2009 |
| JP | 2011-249562 A | 12/2011 |
| JP | 5300471 B2 | 9/2013 |
| JP | 2014-130981 A | 7/2014 |
| JP | 2014-230079 A | 12/2014 |
| JP | 5718536 B2 | 5/2015 |
| WO | 2006/134928 A1 | 12/2006 |

OTHER PUBLICATIONS

English Translation of JP 2014230079 (Year: 2014).*
Official Communication issued in International Patent Application No. PCT/JP2016/059614, dated Jun. 14, 2016.

* cited by examiner

ELECTRONIC COMPONENT

CROSS REFERENCE TO RELATED APPLICATIONS

This application claims the benefit of priority to Japanese Patent Application No. 2015-104356 filed on May 22, 2015 and is a Continuation Application of PCT Application No. PCT/JP2016/059614 filed on Mar. 25, 2016. The entire contents of each application are hereby incorporated herein by reference.

BACKGROUND OF THE INVENTION

1. Field of the Invention

The present invention relates to an electronic component with a hollow structure.

2. Description of the Related Art

To date, various electronic components having a hollow structure have been proposed.

Japanese Patent No. 5300471 describes an electronic component that includes a first element structure disposed on a first substrate and a second element structure disposed on a second substrate. The second element structure is disposed on the first element structure. The electronic component of Japanese Patent No. 5300471 has a hollow space. The first and second element structures are sealed in the hollow space.

In general, in an electronic component in which a plurality of functional element portions are stacked as in Japanese Patent No. 5300471, the functional element portions are connected to each other via connection terminals composed of solder or the like. However, if the electronic component has a hollow space as in Japanese Patent No. 5300471, the hollow space may collapse due to a stress that is applied when mounting the electronic component on a substrate. In particular, as the thickness of electronic components has been increasingly reduced in recent years, if the hollow space collapses, a cover layer that forms the hollow space may contact a functional element portion. If this occurs, the functional element portion may be broken, and the characteristics of the functional element portion may deteriorate.

SUMMARY OF THE INVENTION

Preferred embodiments of the present invention provide electronic components that include a hollow structure with which a hollow space does not easily collapse even if a stress is applied when, for example, mounting the electronic component on a substrate.

An electronic component according to a preferred embodiment of the present invention includes a piezoelectric substrate; a functional electrode that is disposed on the piezoelectric substrate; a support layer that is disposed on the piezoelectric substrate; a cover layer that is disposed on the support layer, the cover layer, the support layer, and the piezoelectric substrate defining a hollow space that the functional electrode faces; and a connection terminal that is electrically connected to the functional electrode, that is made from a metal particle aggregate, and that has a porous structure. The connection terminal is located at a position where the connection terminal overlaps at least a portion of the hollow space in plan view.

In an electronic component according to a preferred embodiment of the present invention, the connection terminal is preferably disposed on the cover layer. Preferably, the cover layer is made of a resin. In this case, breakage of the cover layer is not likely to occur or is prevented from occurring, and the thickness of the electronic component is able to be further reduced.

In an electronic component according to another preferred embodiment of the present invention, the connection terminal preferably has a rectangular or substantially rectangular planar shape. In this case, it is possible to further mitigate a stress that is applied when, for example, mounting the electronic component on a substrate.

In an electronic component according to another preferred embodiment of the present invention, the electronic component preferably further includes another functional electrode that is located above the functional electrode, and an element substrate that is located above the piezoelectric substrate. The other functional electrode is provided on the element substrate and is electrically connected to the connection terminal.

In an electronic component according to another preferred embodiment of the present invention, at least the element substrate and the cover layer define another hollow space that the other functional electrode faces.

In an electronic component according to another preferred embodiment of the present invention, the element substrate is preferably a piezoelectric substrate, and the functional electrode and the other functional electrode are each an IDT electrode.

In an electronic component according to another preferred embodiment of the present invention, the metal particle aggregate preferably includes metal nanoparticles. Preferably, a particle size of the metal nanoparticles is about 0.5 nm or greater and about 50 nm or smaller, for example. More preferably, the percentage of metal nanoparticles whose particle size is about 0.5 nm or greater and about 50 nm or smaller in the metal particle aggregate is about 80% or higher, for example. In this case, it is possible to further increase the cohesiveness of the connection terminals.

In an electronic component according to another preferred embodiment of the present invention, the metal particle aggregate is preferably an aggregate of metal particles that are made of at least one of Au and Cu, for example. In this case, it is possible to further increase the strength of the connection terminal.

In an electronic component according to another preferred embodiment of the present invention, a porosity of the metal particle aggregate is preferably about 2% or higher and about 20% or lower, for example. In this case, the hollow space does not easily collapse, and it is possible to further increase the strength of electrical connection between functional elements.

With electronic components according to various preferred embodiments of the present invention, the connection terminal is able to mitigate a stress that is applied when, for example, mounting the electronic component on a substrate. Accordingly, with the electronic components according to various preferred embodiments of the present invention, the hollow space does not collapse easily even if a stress is applied when, for example, mounting the electronic component on a substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Note that the preferred embodiments described in the present specification are examples, and replacement or combination of elements may be performed between different preferred embodiments.

First Preferred Embodiment

Figure 1:
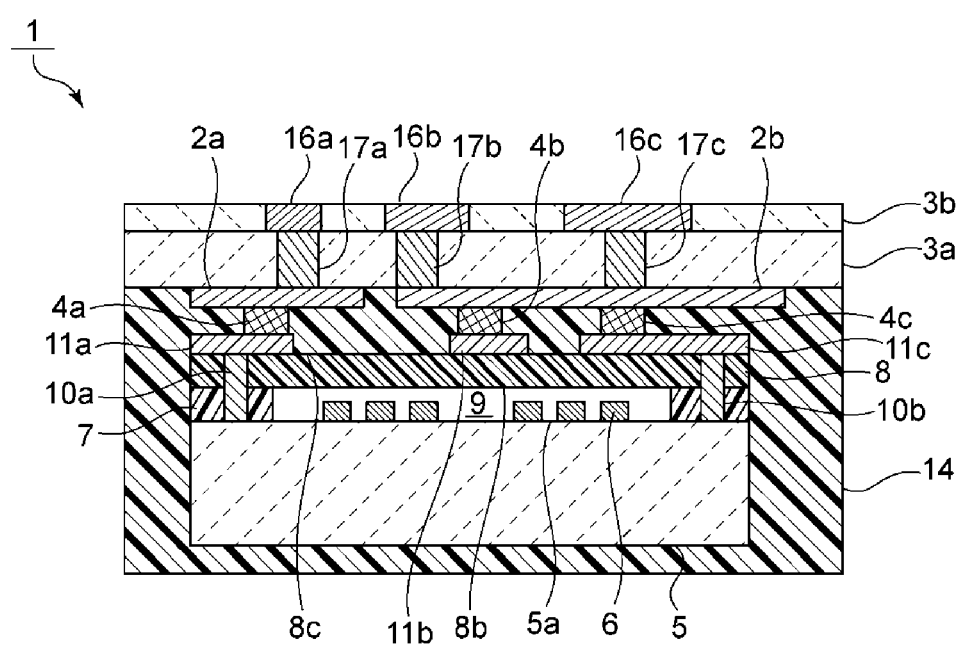
FIG. 1 is a schematic sectional view of an electronic component according to a first preferred embodiment of the present invention.

FIG. 1 is a schematic sectional view of an electronic component according to a first preferred embodiment of the present invention.

An electronic component 1 includes a piezoelectric substrate 5. The piezoelectric substrate 5 includes a first main surface 5a. The piezoelectric substrate 5 preferably has a rectangular or substantially rectangular plate shape. The piezoelectric substrate 5 is a piezoelectric substrate preferably made of $LiTaO_3$, for example. Alternatively, the piezoelectric substrate 5a may be a substrate made of another piezoelectric single crystal, such as $LiNbO_3$, or a substrate made of piezoelectric ceramics.

A first functional electrode 6 is disposed on the first main surface 5a of the piezoelectric substrate 5. The first functional electrode 6 is an IDT electrode. In the present preferred embodiment, the IDT electrode defines an elastic wave resonator, for example. The IDT electrode is preferably made of an appropriate metal or alloy, such as Al, Cu, Ni, Ti, Pt, Ni—Cr, or Al—Cu, for example. The IDT electrode may be a single-layer metal film or may be a multi-layer metal film in which layers of two or more metals or alloys are stacked.

A support layer 7, which is frame-shaped, is disposed on the first main surface 5a of the piezoelectric substrate 5. The support layer 7 surrounds the first functional electrode 6. The support layer 7 is preferably made of a resin. The thickness of the support layer 7 is greater than that of the first functional electrode 6. This is because the thickness of the electrode needs to be smaller than that of the support layer in order for a hollow space to be provided.

A first cover layer 8 is disposed on the support layer 7. The first cover layer 8 is preferably made of a resin. The first cover layer 8 includes second and third main surfaces 8b and 8c. The second main surface 8b of the first cover layer 8 faces the first functional electrode 6. The third main surface 8c is opposite the second main surface 8b. Preferably, the first cover layer 8 is made of a resin as in the electronic component 1, although the first cover layer 8 may be made of Si, for example. When the first cover layer 8 is made of a resin, the first cover layer 8 does not easily break even if the first cover layer 8 is thin, compared to a case in which the first cover layer 8 is made of Si. Therefore, it is possible to further reduce the thickness of the electronic component 1. More specifically, when the first cover layer 8 is made of a resin, it is possible to reduce the thickness of the first cover layer 8 to, for example, about 50 μm or smaller.

In the electronic component 1, the piezoelectric substrate 5, the support layer 7, and the first cover layer 8 define a first hollow space 9 that the first functional electrode 6 faces. As a result, the first functional electrode 6 is sealed in the first hollow space 9.

Electrode lands 11a to 11c are disposed on the third main surface 8c of the first cover layer 8. Via-hole electrodes 10a and 10b are disposed in the first cover layer 8 and the support layer 7. First ends of the via-hole electrodes 10a and 10b are connected to the electrode lands 11a and 11c. Second ends of the via-hole electrodes 10a and 10b are located on the first main surface 5a of the piezoelectric substrate 5. The second ends of the via-hole electrodes 10a and 10b are electrically connected to the first functional electrode 6 via wiring electrodes (not shown). The electrode land 11b is electrically connected to the first functional electrode 6 via a wiring electrode (not shown). The electrode lands 11a to 11c and the via-hole electrodes 10a and 10b are made of an appropriate metal or alloy.

Connection terminals 4a to 4c are disposed on the electrode lands 11a to 11c. The connection terminals 4a to 4c are electrically connected to the first functional electrode 6. The first functional electrode 6 is electrically connected to a first wiring substrate 3a (described below) via the connection terminals 4a to 4c.

The connection terminals 4a to 4c preferably have rectangular or substantially rectangular planar shapes. The planar shapes of the connection terminals 4a to 4c are not particularly limited and may be circular or elliptical, for example. However, preferably, the planar shapes are rectangular or substantially rectangular. By forming the connection terminals 4a to 4c so as to have rectangular or substantially rectangular planar shapes, it is possible to further increase the contact area between the connection terminals 4a to 4c and the electrode lands 11a to 11c. Therefore, it is possible to further mitigate a stress applied from the outside (described below) and to make the hollow space less likely to collapse.

The connection terminals 4b and 4c overlap the first hollow space 9 in plan view. The connection terminal 4a partially overlaps the first hollow space 9 in plan view. In the present preferred embodiment, the connection terminals 4a to 4c may not overlap the first hollow space 9 in plan view or may at least partially overlap the first hollow space 9 in plan view.

If a hard connection terminal exists, such as a solder bump, in a region that overlaps the first hollow space 9 in plan view, the hollow space easily collapses. Therefore, by disposing each of the connection terminals 4a to 4c, which is made from a metal particle aggregate and has a porous structure, in a region that overlaps the first hollow space 9 in plan view, the hollow space is less likely to collapse.

When the cover layer is primarily composed of a resin, the cover layer is suitable for use with the connection terminals 4a to 4c, each of which is made from a metal particle aggregate and has a porous structure. The reason for this is as follows. If a solder bump is used, when heating the solder bump, the heat may be transferred to the resin cover layer and the resin cover layer may soften. As a result, the hollow space becomes more likely to collapse, because a stress is further applied to the elastic wave resonator due to cure shrinkage of the resin cover layer or due to a difference in coefficient of linear expansion. On the other hand, by using the connection terminals 4a to 4c, each of which is made from a metal particle aggregate and has a porous structure, it is possible to connect the resin cover layer to a mount substrate without applying heat, and it is not likely that heat is transferred to the resin cover layer. As a result, a stress is not generated, and the hollow space is easily maintained.

Electrode lands 2a and 2b are disposed on the connection terminals 4a to 4c. Accordingly, first ends of the connection terminals 4a to 4c are connected to the electrode lands 2a and 2b. Second ends of the connection terminals 4a to 4c are connected to the electrode lands 11a to 11c.

A sealing resin layer 14 covers the piezoelectric substrate 5, the support layer 7, the first cover layer 8, the connection terminals 4a to 4c, the electrode lands 2a and 2b, and the electrode lands 11a to 11c.

The first and second wiring substrates 3a and 3b, which are mount substrates, are disposed on the sealing resin layer 14. The first and second wiring substrates 3a and 3b are preferably made of glass epoxy, epoxy, silica-containing resin, or other suitable material. The second wiring substrate 3b is disposed on the first wiring substrate 3a. Conductors 17a to 17c are disposed in the first wiring substrate 3a. Electrode lands 16a to 16c are disposed in the second wiring substrate 3b. First ends of the conductors 17a to 17c are connected to the electrode lands 16a to 16c. Second ends of the conductors 17a to 17c are connected to the electrode lands 2a and 2b. It is possible to connect the electronic component 1 to external electrodes via the electrode lands 16a to 16c.

The connection terminals 4a to 4c are each preferably made from a metal particle aggregate and each have a porous structure. Therefore, the connection terminals 4a to 4c absorb a load or shock that is applied when, for example, mounting the electronic component 1 on a substrate. As a result, even if a stress is applied when, for example, mounting the electronic component 1 on a substrate, the connection terminals 4a to 4c are able to mitigate the stress, and therefore, the first hollow space 9 does not easily collapse.

The connection terminals 4a to 4c, having the structure described above, absorb a stress due to cure shrinkage of the first cover layer 8 and the sealing resin layer 14, a thermal stress, and a stress from the outside. Therefore, the first hollow space 9 does not easily collapse. Moreover, the first cover layer 8 and the sealing resin layer 14 do not contact the first functional electrode 6, and it is also possible to reduce or prevent breakage of the first functional electrode 6. Thus, the connection terminals 4a to 4c not only make the hollow space less likely to collapse due to a stress that is generated in the manufacturing process, but also mitigate a stress from the outside during use.

The connection terminals 4a to 4c have flexibility due to the porous structure thereof. Therefore, even if the connection terminals 4a to 4c have small thicknesses, wire breakage does not occur easily. Moreover, the electronic component 1 is able to reduce or prevent breakage of the first functional electrode 6 as described above. Thus, the thickness of the electronic component 1 is able to be further reduced.

Because the connection terminals 4a to 4c have high activities, the connection terminals 4a to 4c enable strong and low-resistance connection without using pressure, heat, supersonic vibration, and flux when mounting the electronic component 1 on a substrate. Because the connection terminals 4a to 4c are able to be connected at a low temperature, it is possible to reduce or prevent metal diffusion and to obtain good characteristics. Because flux is not necessary, the electronic component 1 includes no corrosive component. Because the electronic component 1 is able to be mounted with a low load, the hollow space is less likely to collapse and breakage of the functional electrode is not likely to occur. Accordingly, the electronic component 1 has high reliability.

The connection terminals 4a to 4c are each preferably made from a metal particle aggregate that is an aggregate of metal particles. Although not particularly limited, preferably, the material of the metal particles of the metal particle aggregate is Au, Cu, or an alloy of these, for example. These materials may be used individually or in combination. When the material of the metal particles of the metal particle aggregate is Au or Cu, it is possible to further increase the strength of the connection terminals 4a to 4c, and breakage of the connection terminals 4a to 4c is not likely to occur. When the material of the metal particles of the metal particle aggregate is Au or Cu, the resistance is further reduced, and therefore, it is possible to obtain good characteristics.

Preferably, the metal particle aggregate includes metal nanoparticles. In this case, the metal particle aggregate may be composed of only metal nanoparticles or may further include metal microparticles.

The particle size of the metal nanoparticles is preferably about 0.5 nm or greater, more preferably about 1 nm or greater, and preferably about 500 nm or smaller, for example. In order to further increase the interfacial activity of metal nanoparticles and to further increase cohesiveness at low temperatures, more preferably, the percentage of metal nanoparticles whose particle size is about 0.5 nm or greater and about 50 nm or smaller in the metal particle aggregate is about 80% or higher, for example. The particle size of metal nanoparticles is defined as the maximum of the lengths of metal particles. It is possible to measure the particle size of the metal nanoparticles by repeating the following steps: measuring a metal portion to be measured by using a transmission electron microscope; cutting into the metal portion by using an ion beam; and measuring a new cross section by using the transmission electron microscope.

A method of manufacturing the metal nanoparticles is not particularly limited. For example, when the metal nanoparticles are Au nanoparticles, it is possible to produce the metal nanoparticles by dissolving Sn of an Au—Sn alloy by using nitric acid. When the metal nanoparticles are Cu nanoparticles, it is possible to produce the metal nanoparticles by dissolving Al of an Al—Cu alloy by using hydrochloric acid.

Preferably, the porosity of the metal particle aggregate is about 2% or higher and about 20% or lower, for example. When the porosity of the metal particle aggregate is in the above range, the hollow space is less likely to collapse, and it is possible to reduce resistivity. The porosity of the metal particle aggregate is measured as follows. In the same manner as the method of measuring the particle size of the metal nanoparticles, it is possible to measure the porosity of the metal particle aggregate by repeating the following steps: measuring a metal portion to be measured by using a transmission electron microscope; cutting into the metal portion by using an ion beam; and measuring a new cross section by using the transmission electron microscope.

Hereinafter, the particle size of the metal nanoparticles and the porosity of the metal particle aggregate will be specifically described using Examples 1 and 2.

In Example 1, a plurality of electronic components 1, between which the particle size of the metal nanoparticles differed, were made; and the insertion loss of a 1800 MHz band elastic wave filter defined by the first functional electrode 6 was measured. Table 1 shows the results.

TABLE 1

| Particle Size of Metal Nanoparticles (nm) | Insertion Loss of 1800 MHz Band Elastic Wave Filter (dB) |
|---|---|
| 1 | 1.6 |
| 3 | 1.6 |
| 5 | 1.6 |
| 10 | 1.6 |
| 20 | 1.6 |
| 50 | 1.7 |
| 100 | 1.9 |
| 200 | 2.1 |
| 500 | 2.3 |
| 1000 | 6.1 |

As can be clearly seen from Table 1, when the particle size of the metal nanoparticles was about 1 nm or greater and about 500 nm or smaller, the insertion loss of the 1800 MHz band elastic wave filter was effectively reduced.

In Example 2, a plurality of electronic components 1, between which the porosity of the metal particle aggregate differed, were made; and the collapse ratio of the first hollow space 9, which was defined by the first cover layer 8 and the resistance of the metal particle aggregate, was measured. When measuring the collapse ratio of the first hollow space 9, first, samples of the electronic components 1 in which the first hollow space 9 did not collapse, were selected. Next, a heat cycle test in a range of about 40° C. to about 125° C. was repeated for 500 cycles; and whether or not the first cover layer 8 and the first functional electrode 6 were in contact with each other was observed. The collapse ratio of the first hollow space 9 was obtained from the percentage of samples in which the hollow space collapsed when a test of n=20 was performed. Table 2 shows the results.

TABLE 2

| Porosity of Metal Particle Aggregate | Hollow Space Collapse Ratio | Resistivity ($\Omega \cdot cm$) |
|---|---|---|
| 0% | 100% | 2.3 |
| 1% | 100% | 2.3 |
| 2% | 40% | 2.5 |
| 3% | 30% | 2.8 |
| 5% | 5% | 3.4 |
| 10% | 5% | 5.5 |
| 20% | 0% | 8.4 |
| 30% | 0% | 1000 or higher |
| 40% | 0% | 1000 or higher |
| 50% | not formable | |

As can be clearly seen from Table 2, when the porosity of the metal aggregate was about 2% or higher and about 20% or lower, both of the collapse ratio of the first hollow space 9 and the resistivity were further reduced.

Second Preferred Embodiment

Figure 2:
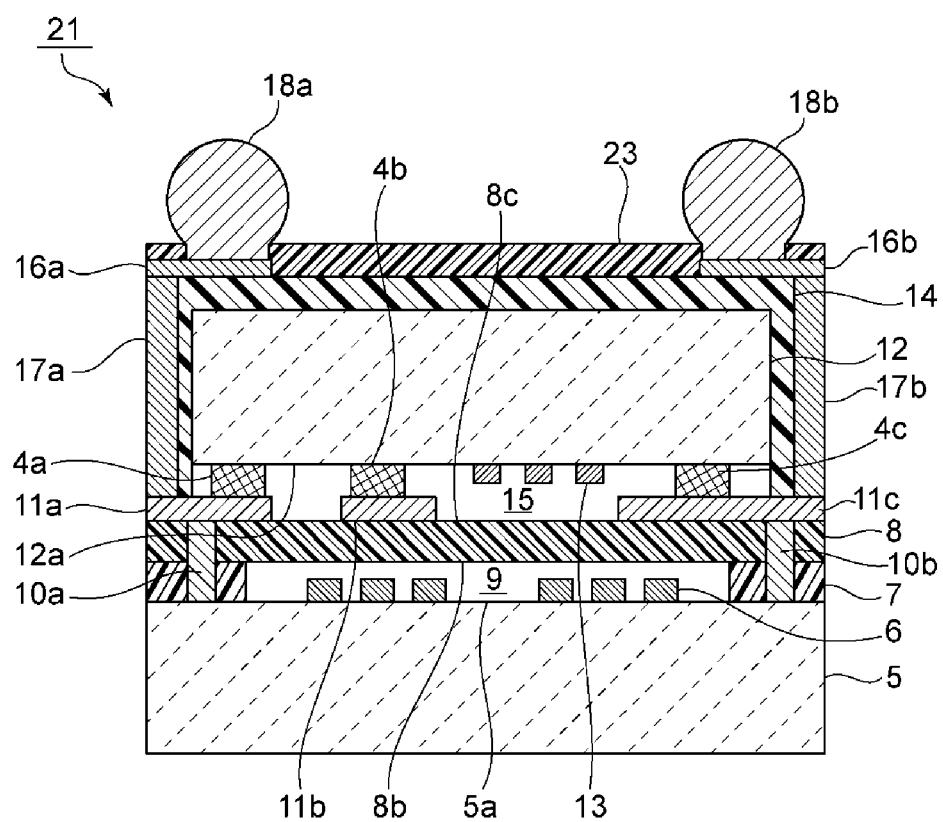
FIG. 2 is a schematic sectional view of an electronic component according to a second preferred embodiment of the present invention.

FIG. 2 is a schematic sectional view of an electronic component according to a second preferred embodiment of the present invention. As illustrated in FIG. 2, an electronic component 21 includes an element substrate 12. The element substrate 12 includes a fourth main surface 12a. The element substrate 12 preferably has a rectangular or substantially rectangular plate shape. The element substrate 12 is preferably a piezoelectric substrate made of LiTaO$_3$, for example. Alternatively, the element substrate 12 may be a substrate made of another piezoelectric single crystal, such as LiNbO$_3$, or a substrate made of piezoelectric ceramics, for example. The element substrate 12 is not limited to such a piezoelectric substrate and may be made of Si, sapphire, quartz, GaAs, SiC, aluminum nitride, or other suitable material, for example.

A second functional electrode 13 is disposed on the fourth main surface 12a of the element substrate 12. In the present preferred embodiment, the second functional electrode 13 is an IDT electrode. The IDT electrode is preferably made of an appropriate metal or alloy, such as Al, Cu, Ni, Ti, Pt, Ni—Cr, or Al—Cu, for example. The IDT electrode may be a single-layer metal film or may be a multi-layer metal film in which layers of two or more metals or alloys are stacked.

In the electronic component 21, the second functional electrode 13 also defines an elastic wave resonator. As illustrated in FIG. 2, the electronic component 21 is a stack of an elastic wave resonator that includes the first functional electrode 6 and an elastic wave resonator that includes the second functional electrode 13. Connection terminals 4a to 4c are used to connect the two elastic wave resonators to each other.

More specifically, in the electronic component 21, the element substrate 12 is disposed on the connection terminals 4a to 4c. As a result, first ends of the connection terminals 4a to 4c are connected to the element substrate 12. Second ends of the connection terminals 4a to 4c are connected to electrode lands 11a to 11c. Accordingly, the electrode lands 11a to 11c are electrically and mechanically connected to the element substrate 12 via the connection terminals 4a to 4c. Thus, the first and second functional electrodes 6 and 13 are electrically connected to each other.

In the electronic component 21, a sealing resin layer 14 is disposed on a first cover layer 8. The sealing resin layer 14 covers the element substrate 12. The sealing resin layer 14, the element substrate 12, and the first cover layer 8 define a second hollow space 15 that the second functional electrode 13 faces. The second functional electrode 13 is sealed in the second hollow space 15.

The connection terminals 4b and 4c overlap the first and second hollow spaces 9 and 15 in plan view. The connection terminal 4a partially overlaps the first and second hollow spaces 9 and 15 in plan view. In the present preferred, the connection terminals 4a to 4c may not overlap the first and second hollow spaces 9 and 15 in plan view or may at least partially overlap the first and second hollow spaces 9 and 15 in plan view. With the present preferred embodiment, because the connection terminals 4a to 4c are structured as described above, even when the connection terminals 4a to 4c overlap the first and second hollow spaces 9 and 15, the hollow space does not easily collapse.

Conductors 17a and 17b are disposed on portions of the outer surface of the sealing resin layer 14. Electrode lands 16a and 16b are disposed on the sealing resin layer 14 and the conductors 17a and 17b. First ends of the conductors 17a and 17b are connected to the electrode lands 16a and 16b. Second ends of the conductors 17a and 17b are connected to the electrode lands 11a and 11c.

Bump electrodes 18a and 18b are disposed on the electrode lands 16a and 16b. Examples of the bump electrodes 18a and 18b include solder bumps and Au bumps. It is possible to surface-mount the electronic component 21 on a circuit substrate by placing a surface of the electronic component 21 with the bump electrodes 18a and 18b onto the substrate. In the electronic component 21, a second cover layer 23 covers the electrode lands 16a and 16b and a portion of each of the bump electrodes 18a and 18b. In other aspects, the second preferred embodiment is the same or substantially the same as the first preferred embodiment.

Also in the electronic component 21, the connection terminals 4a to 4c are each preferably made from a metal particle aggregate and each have a porous structure. Therefore, the connection terminals 4a to 4c are able absorb a load or shock that is applied when, for example, mounting the electronic component 21 on a substrate. As a result, even if a stress is applied when, for example, mounting the electronic component 21 on a substrate, the connection terminals 4a to 4c are able to mitigate the stress, and the first and second hollow spaces 9 and 15 do not easily collapse.

A method of manufacturing the electronic component 21 is not particularly limited. Referring to FIGS. 3A to 3D, a non-limiting example of the method will be described.

Figure 3A:
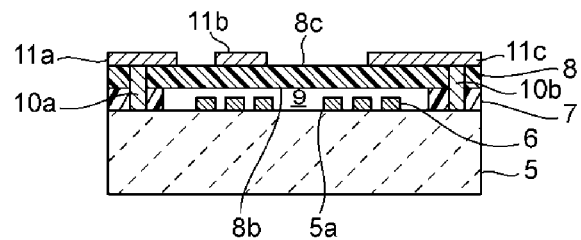
FIGS. 3A to 3D are schematic sectional views illustrating an example of a method for manufacturing the electronic component according to the second preferred embodiment of the present invention.

First, as illustrated in FIG. 3A, the first functional electrode 6, which is an IDT electrode, is formed on the first main surface 5a of the piezoelectric substrate 5, which is preferably made of $LiTaO_3$. Subsequently, circuit wiring, busbars, extended wiring, and pad metal layers (not shown) are patterned.

Next, a package that seals the first functional electrode 6 is formed. More specifically, first, the support layer 7 to define the first hollow space 9 is made from a photosensitive resin. In this example of a manufacturing method, the thickness of the resin is preferably set at about 1 μm, for example, in order to reduce the thickness of the electronic component 21. Next, the first cover layer 8, which covers the first hollow space 9, is formed by laminating a resin film preferably having a thickness of about 10 μm, for example. Preferably, the first cover layer 8 is made from a resin film, because it is advantageous to use a thin resin film in order to reduce the thickness of the electronic component 21 and because a roll lamination process, which is a low-cost process, is able to be used.

Next, holes are formed in the first cover layer 8 and the support layer 7, and via-hole electrodes 10a and 10b are formed in the holes. Next, the electrode lands 11a to 11c are formed on the third main surface 8c of the first cover layer 8. Thus, a structure including the first functional electrode 6 is formed.

Figure 3B:
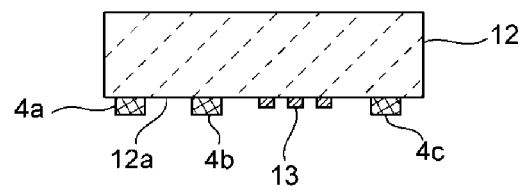

Next, as illustrated in FIG. 3B, the second functional electrode 13, which is an IDT electrode, is formed on the fourth main surface 12a of the element substrate 12, which is preferably made of $LiTaO_3$, for example. Subsequently, circuit wiring, busbars, extended wiring, and pad metal layers (not shown) are patterned. Next, the connection terminals 4a to 4c, each of which is preferably an aggregate of Au nanoparticles (metal particle aggregate), are formed as connection terminals.

When forming the connection terminals 4a to 4c, first, a conductive film is formed, and then a photoresist pattern is formed. Next, electroplating of an Au—Sn alloy, for example, is preferably performed. At this time, electroplating is performed by using an Au—Sn alloy plating solution under a current density that is suitable for depositing Sn on the grain boundary of Au and for forming nanoscale particles. Next, Sn is etched away from the Au—Sn alloy by using nitric acid, to form the connection terminals 4a to 4c, each of which is preferably made from an Au nanoparticle aggregate and has a porous structure, for example. Next, the resist is peeled off. Thus, the connection terminals 4a to 4c, each of which is preferably made from an Au nanoparticle aggregate and has a porous structure, for example, are formed. Thus, a structure including the second functional electrode 13 is made.

Figure 3C:
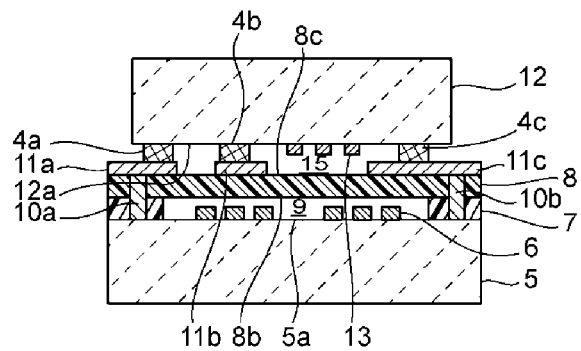

Next, as illustrated in FIG. 3C, the structure including the second functional electrode 13 is connected to the structure including the first functional electrode 6 via the connection terminals 4a to 4c. Because the connection terminals 4a to 4c are each made from a porous metal composed of an Au nanoparticle aggregate, it is possible to connect these structures at a normal temperature and with a low load. Therefore, the first cover layer 8 is not likely to soften, and deformation due to a load is small. Accordingly, collapse of the hollow space in the elastic wave filter, which is in a base portion of the electronic component 21, is not likely to occur when mounting the electronic component 21 on a substrate. In this manufacturing method, the thicknesses of the connection terminals 4a to 4c are preferably set at about 1 μm, for example, in order to reduce the thickness of the electronic component 21. Nevertheless, because the connection terminals 4a to 4c are flexible, wire breakage is not likely to occur. Therefore, the electronic component 21 has high reliability.

Figure 3D:
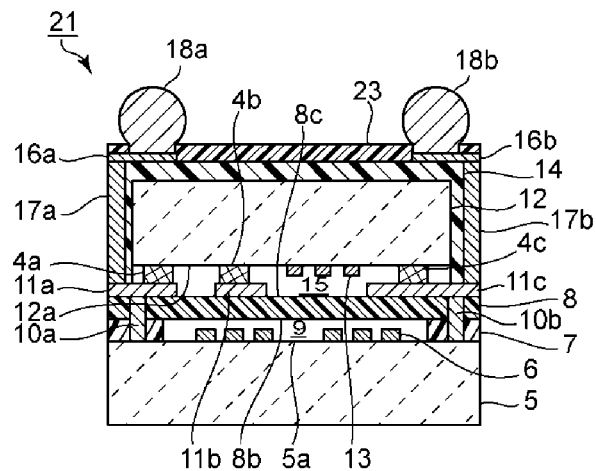

Next, wiring is formed by extending wiring of the second functional electrode 13, which has been mounted, from a side to the back side. Lastly, as illustrated in FIG. 3D, resin sealing is performed while maintaining the first and second hollow spaces 9 and 15, terminal offset wiring is formed, and a protective film is formed. Thus, the electronic component 21 is obtained.

As described above, in the electronic component 21, the first and second functional electrodes 6 and 13 form a stack of two elastic wave resonators. The first and second functional electrodes 6 and 13 are electrically connected to each other via the connection terminals 4a to 4c.

The first and second functional electrodes 6 and 13 are not limited to electrodes for elastic wave resonators. The first and second functional electrodes 6 and 13 may each define any suitable functional element, such as a resonator, a vibrator, or a filter. Examples of the resonator include an elastic wave resonator, a plate wave resonator, and a bulk wave resonator. Examples of the vibrator include a piezoelectric vibrator and a MEMS vibrator. Examples of the filter include an elastic wave filter. In preferred embodiments of the present invention, the connection terminals 4a to 4c are used to connect such functional elements to each other. Examples of functional elements to be connected to each other by the connection terminals 4a to 4c further include a piezoelectric gyroscope, a semiconductor device, and an IC. Although not particularly limited, examples of combinations of such elements will be described below in third to seventh preferred embodiments of the present invention.

Third Preferred Embodiment

Figure 4:
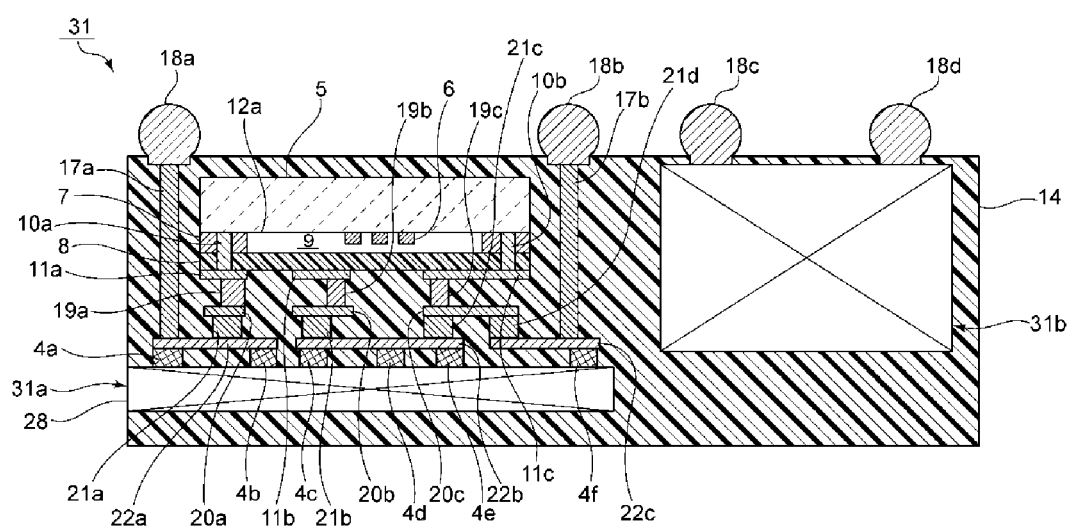
FIG. 4 is a schematic sectional view of an electronic component according to a third preferred embodiment of the present invention.

FIG. 4 is a schematic sectional view of an electronic component according to a third preferred embodiment of the present invention. As illustrated in FIG. 4, an electronic component 31 preferably includes two electronic component units 31a and 31b that are adjacent to each other. In the electronic component unit 31a, a semiconductor element 28 is disposed on an elastic wave resonator defined by a first functional electrode 6. Connection terminals 4a to 4f are used to connect the elastic wave resonator and the semiconductor element 28 to each other.

In the electronic component 31, a first hollow space 9 is provided so that the first functional electrode 6 faces the first hollow space 9. However, a second hollow space 15 is not provided in the electronic component 31. As in this case, in preferred embodiments of the present invention, it is sufficient that at least one hollow space is provided.

In the electronic component 31, the electronic component units 31a and 31b are covered by a sealing resin layer 14.

In the electronic component 31, via-hole electrodes 19a to 19c are disposed on electrode lands 11a to 11c. Electrode lands 20a to 20c are connected to end portions of the via-hole electrodes 19a to 19c opposite to end portions at which the electrode lands 11a to 11c are disposed.

Via-hole electrodes 21a to 21d are disposed on the electrode lands 20a to 20c. Electrode lands 22a to 22c are connected to end portions of the via-hole electrodes 21a to 21d opposite to end portions at which the electrode lands 20a to 20c are disposed.

Connection terminals 4a to 4f are disposed on the electrode lands 22a to 22c. The electrode lands 22a to 22c are electrically and mechanically connected to the semiconductor element 28 via the connection terminals 4a to 4f. Thus, the first functional electrode 6 and the semiconductor element 28 are electrically connected to each other.

The connection terminals 4b to 4e are disposed so as to overlap the first hollow space 9 in plan view. The connection terminals 4a and 4f do not overlap the first hollow space 9 in plan view. As in this case, the connection terminals 4a to 4f may at least partially overlap or may not overlap the first hollow space 9 in plan view. In preferred embodiments of the present invention, because the connection terminals 4a to 4f have the structure described above, the hollow space does not easily collapse even if the connection terminals 4a to 4f overlap the first hollow spaces 9.

Conductors 17a and 17b are connected to the electrode lands 22a to 22c. First ends of the conductors 17a and 17b are connected to surfaces of the electrode lands 22a and 22c opposite to surfaces on which the connection terminals 4a, 4b, and 4f are disposed. Second ends of the conductors 17a and 17b are connected to bump electrodes 18a and 18b. The electronic component unit 31b is connected to bump electrodes 18c and 18d. It is possible to surface-mount the electronic component 31 on a circuit substrate by placing a surface of the electronic component 31 having the bump electrodes 18a to 18d onto the circuit substrate. In other aspects, the third preferred embodiment is the same or substantially the same as the second preferred embodiment.

Fourth Preferred Embodiment

Figure 5:
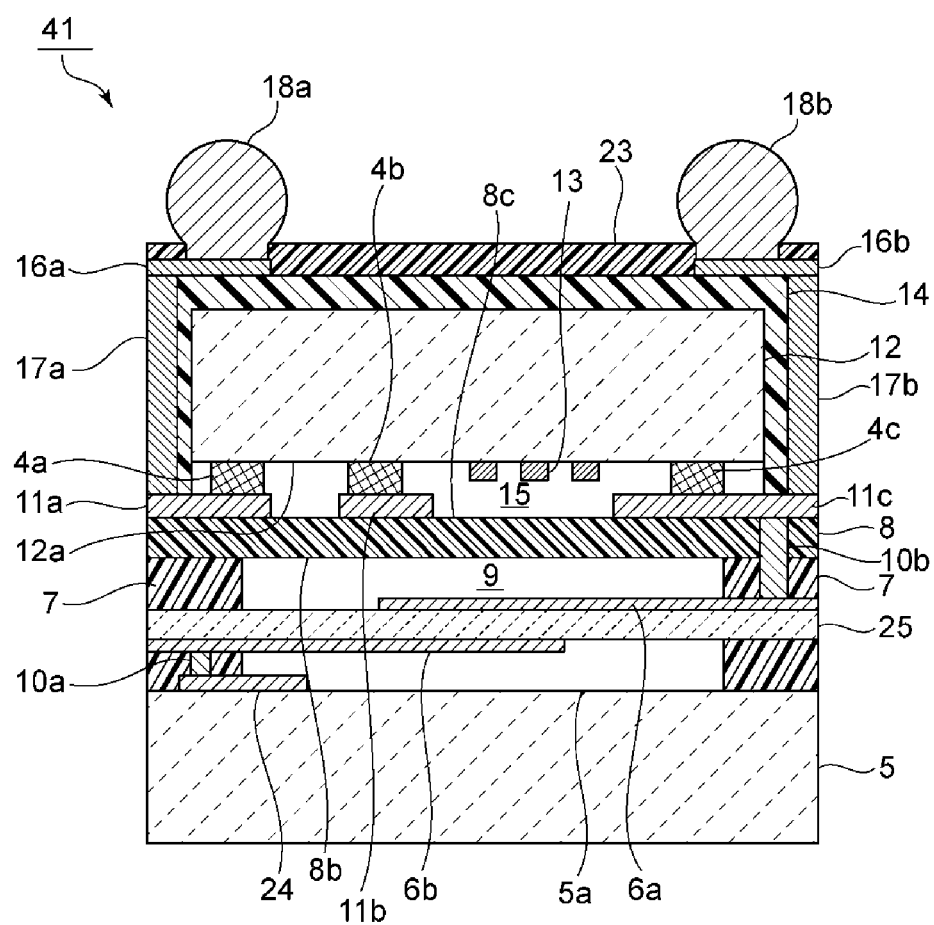
FIG. 5 is a schematic sectional view of an electronic component according to a fourth preferred embodiment of the present invention.

FIG. 5 is a schematic sectional view of an electronic component according to a fourth preferred embodiment of the present invention. As illustrated in FIG. 5, in an electronic component 41, first functional electrodes 6a and 6b define a bulk wave resonator. A second functional electrode 13 defines an elastic wave resonator. The elastic wave resonator is disposed on the bulk wave resonator. Connection terminals 4a to 4c are used to connect the elastic wave resonator and the bulk wave resonator to each other.

In the electronic component 41, the first functional electrodes 6a and 6b and a piezoelectric layer 25 are disposed between portions of a support layer 7. The first functional electrode 6a is disposed on a main surface of the piezoelectric layer 25 facing the second functional electrode 13. The first functional electrode 6b is disposed on a main surface of the piezoelectric layer 25 opposite to the main surface on which the first functional electrode 6a is disposed.

In the electronic component 41, a portion in which the first functional electrode 6a and the first functional electrode 6b overlap each other with the piezoelectric layer 25 therebetween defines a piezoelectric vibrator. That is, when an alternate-current electric field is applied between the first functional electrode 6a and the first functional electrode 6b, the piezoelectric vibrator vibrates. The bulk wave resonator uses a bulk wave generated by the vibration of the piezoelectric vibrator. A portion of the piezoelectric vibrator is located in the support layer 7 and the remaining portion of the piezoelectric vibrator is located in a first hollow space 9. The first functional electrodes 6a and 6b are sealed in the first hollow space 9.

An electrode land 24 is disposed on a first main surface 5a of the piezoelectric substrate 5. A via-hole electrode 10a is disposed in the support layer 7. The via-hole electrode 10a connects the electrode land 24 and the first functional electrode 6b to each other. A via-hole electrode 10b is disposed in the support layer 7 and the first cover layer 8. The via-hole electrode 10b connects an electrode land 11c and the first functional electrode 6a to each other. In other aspects, the fourth preferred embodiment is the same or substantially the same as the second preferred embodiment.

Fifth Preferred Embodiment

Figure 6:
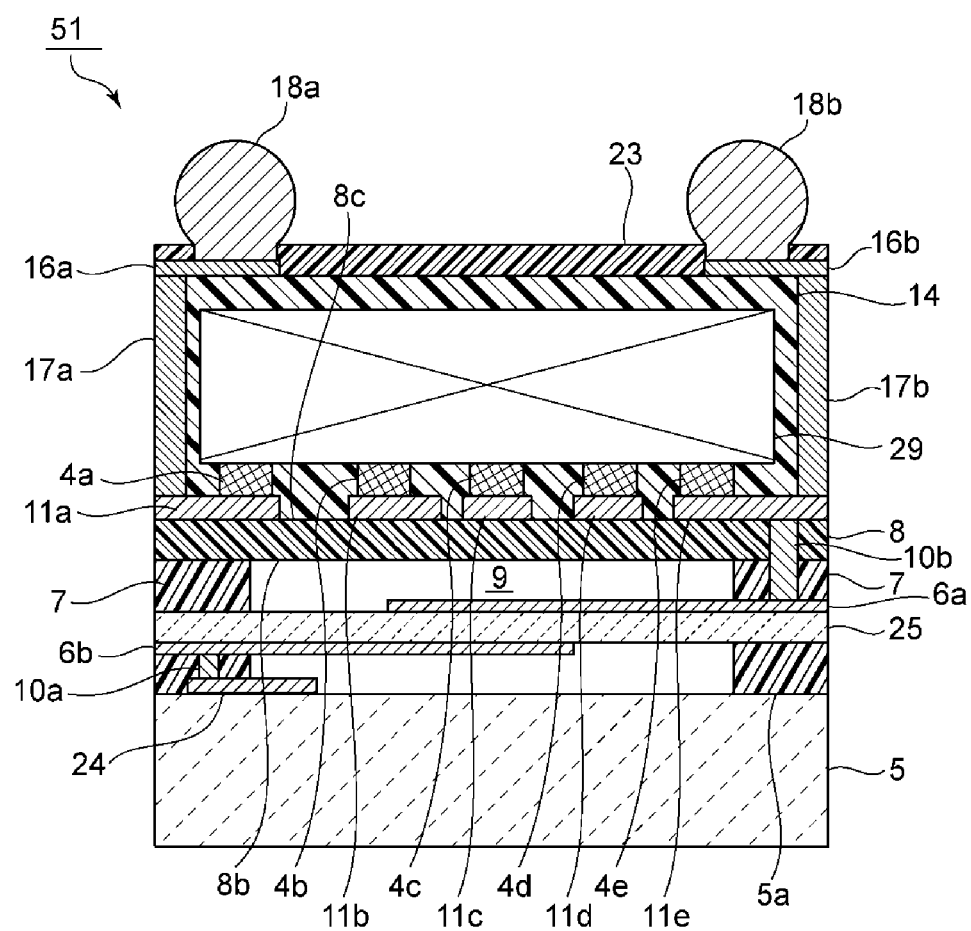
FIG. 6 is a schematic sectional view of an electronic component according to a fifth preferred embodiment of the present invention.

FIG. 6 is a schematic sectional view of an electronic component according to a fifth preferred embodiment of the present invention. As illustrated in FIG. 6, in an electronic component 51, first functional electrodes 6a and 6b define a bulk wave resonator. An IC 29 is disposed above the bulk wave resonator. Connection terminals 4a to 4e are used to connect the bulk wave resonator and the IC 29 to each other.

In the electronic component 51, electrode lands 11a to 11e are disposed on a third main surface 8c of a first cover layer 8. The connection terminals 4a to 4e are disposed on the electrode lands 11a to 11e. The electrode lands 11a to 11e are electrically and mechanically connected to the IC 29 via the connection terminals 4a to 4e. Thus, the bulk wave resonator and the IC 29 are electrically connected to each other. In other aspects, the fifth preferred embodiment is the same or substantially the same as the fourth preferred embodiment.

Sixth Preferred Embodiment

Figure 7:
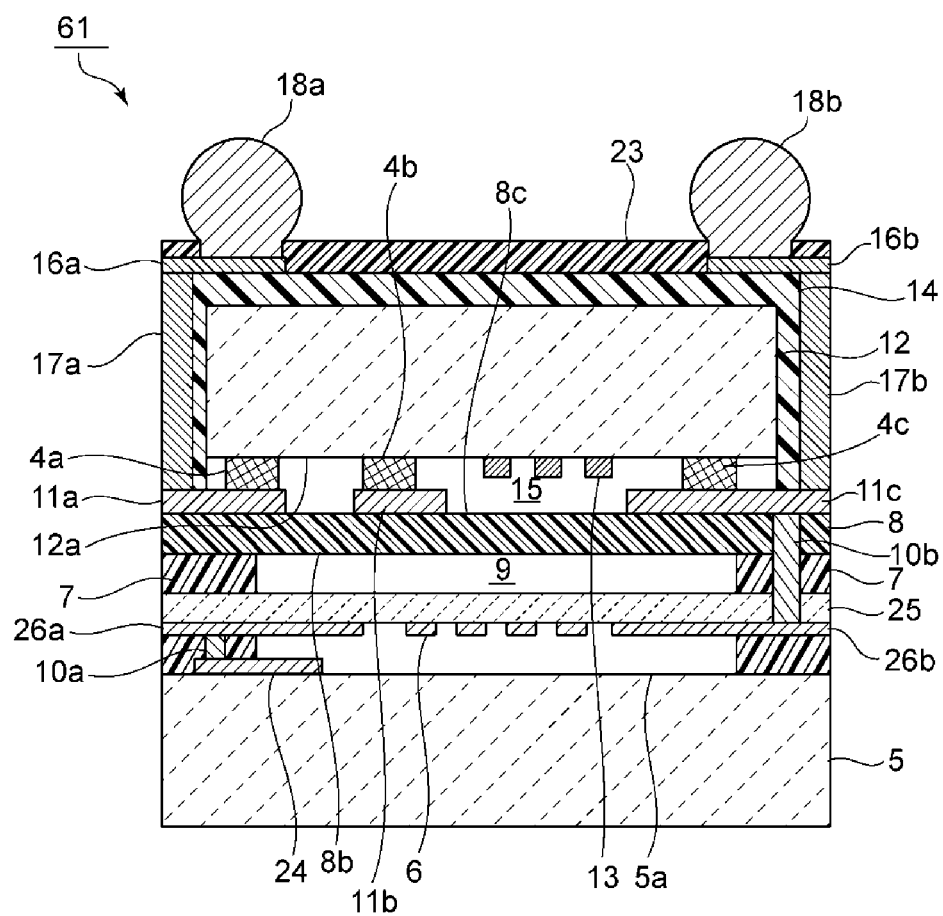
FIG. 7 is a schematic sectional view of an electronic component according to a sixth preferred embodiment of the present invention.

FIG. 7 is a schematic sectional view of an electronic component according to a sixth preferred embodiment of the present invention. As illustrated in FIG. 7, in an electronic component 61, a first functional electrode 6 defines a plate wave resonator. A second functional electrode 13 defines an elastic wave resonator. The elastic wave resonator is disposed on the plate wave resonator. Connection terminals 4a to 4c are used to connect the elastic wave resonator and the plate wave resonator to each other.

In the electronic component 61, a piezoelectric layer 25 and electrode lands 26a and 26b are disposed between portions of a support layer 7. The electrode lands 26a and 26b and the first functional electrode 6 are disposed on a main surface of the piezoelectric layer 25 facing a piezoelectric substrate 5. The first functional electrode 6 is disposed between the electrode lands 26a and 26b. The first functional electrode 6 is preferably an IDT electrode. The plate wave resonator uses a plate wave as an elastic wave excited by the IDT electrode. The first functional electrode 6 is disposed in a first hollow space 9. Accordingly, the first functional electrode 6 is sealed in the first hollow space 9.

An electrode land 24 is disposed on a first main surface 5a of the piezoelectric substrate 5. A via-hole electrode 10a is disposed in the support layer 7. The via-hole electrode 10a connects the electrode land 24 and the electrode land 26a to each other. A via-hole electrode 10b is disposed in the support layer 7, the first cover layer 8, and the piezoelectric layer 25. The via-hole electrode 10b connects the electrode land 11c and the electrode land 26b to each other. The first functional electrode 6 and the electrode lands 26a and 26b are electrically connected to each other. In other aspects, the sixth preferred embodiment is the same or substantially the same as the second preferred embodiment.

Seventh Preferred Embodiment

Figure 8:
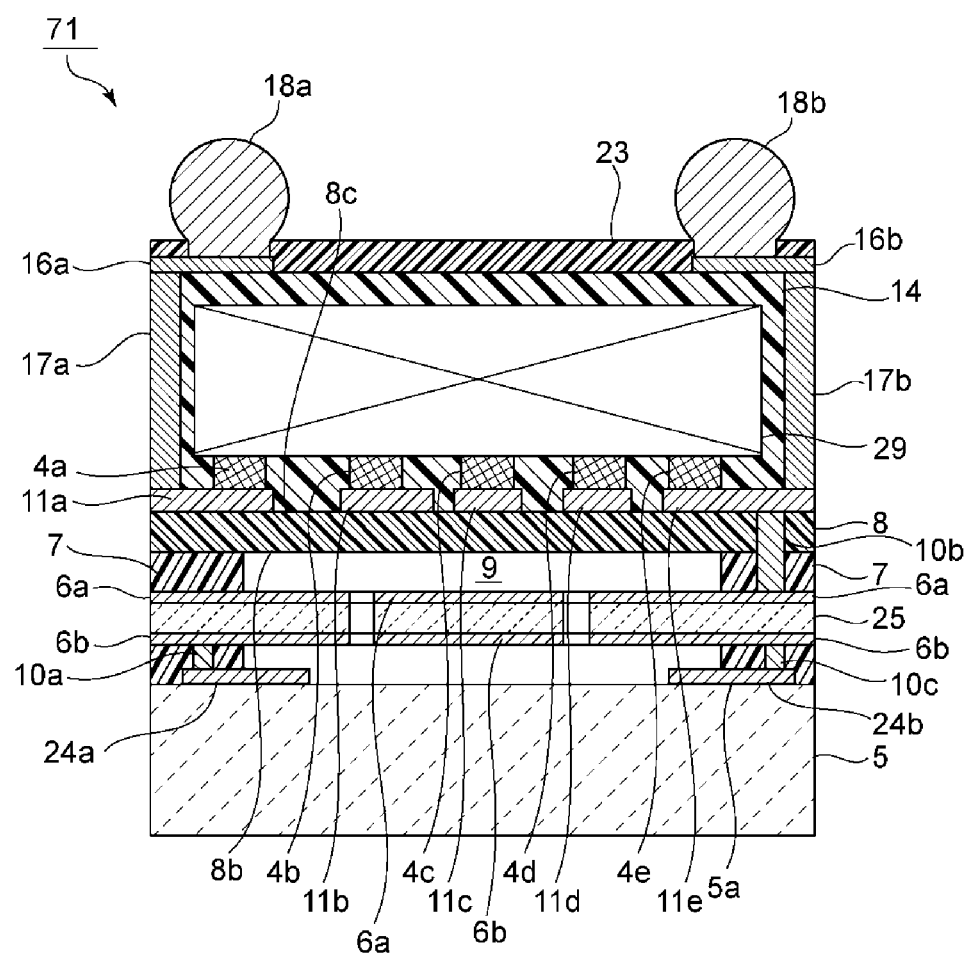
FIG. 8 is a schematic sectional view of an electronic component according to a seventh preferred embodiment of the present invention.

FIG. 8 is a schematic sectional view of an electronic component according to a seventh preferred embodiment of the present invention. As illustrated in FIG. 8, in an electronic component 71, first functional electrodes 6a and 6b define a MEMS (Micro Electro Mechanical Systems) vibrator. An IC 29 is disposed on the MEMS vibrator. Connection terminals 4a to 4e are used to connect the MEMS vibrator and the IC 29 to each other.

In the electronic component 71, a piezoelectric layer 25 and the first functional electrodes 6a and 6b are disposed between portions of a support layer 7. The first functional electrode 6a is disposed on a main surface of the piezoelectric layer 25 facing to the IC 29. The first functional electrode 6b is disposed on a main surface of the piezoelectric layer 25 opposite to the main surface on which the first functional electrode 6a is disposed.

Electrode lands 24a and 24b are disposed on a first main surface 5a of a piezoelectric substrate 5. Via-hole electrodes 10a and 10c are disposed in the support layer 7. The via-hole electrodes 10a and 10c electrically connect the electrode lands 24a and 24b and the first functional electrode 6b to each other. In the present preferred embodiment, the piezoelectric substrate 5 is made of a Si semiconductor. Thus, the MEMS vibrator, which includes a vibration portion including the piezoelectric layer 25, is provided on the Si semiconductor. The first functional electrodes 6a and 6b are disposed in the first hollow space 9.

A via-hole electrode 10b is disposed in the support layer 7 and a first cover layer 8. The via-hole electrode 10b connects an electrode land 11e and the first functional electrode 6a to each other. In other aspects, the seventh preferred embodiment is the same or substantially the same as the fifth preferred embodiment.

In the electronic components 31 to 71 according to the third to seventh preferred embodiments, at least one hollow space is provided, and the electronic components 31 to 71 include the connection terminals 4a to 4f. The connection terminals 4a to 4f have the structure described above. Thus, also with the electronic components 31 to 71 according to the third to seventh preferred embodiments, the hollow space does not easily collapse even if a stress is applied when, for example, mounting the electronic component on a substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a piezoelectric substrate;
    a functional electrode that is disposed on the piezoelectric substrate;
    a support layer that is disposed on the piezoelectric substrate;
    a cover layer that is disposed on the support layer, the cover layer, the support layer, and the piezoelectric substrate defining a hollow space that the functional electrode faces;
    a connection terminal that is electrically connected to the functional electrode, that is made from a metal particle aggregate, and that has a porous structure; and
    at least one electrode land; wherein
    the connection terminal is located at a position in which the connection terminal overlaps at least a portion of the hollow space in plan view; and
    the position of the connection terminal is located inside of the hollow space and/or between the functional electrode and the at least one electrode land.

2. The electronic component according to claim 1, wherein the connection terminal is disposed on the cover layer.

3. The electronic component according to claim 1, wherein the cover layer is made of a resin.

4. The electronic component according to claim 1, wherein the connection terminal has a rectangular or substantially rectangular planar shape.

5. The electronic component according to claim 1, further comprising:
    another functional electrode that is located above the functional electrode; and
    an element substrate that is located above the piezoelectric substrate; wherein
    the another functional electrode is provided on the element substrate and is electrically connected to the connection terminal.

6. The electronic component according to claim 5, wherein at least the element substrate and the cover layer define another hollow space that the another functional electrode faces.

7. The electronic component according to claim 5, wherein
    the element substrate is a piezoelectric substrate; and
    the functional electrode and the another functional electrode are each an IDT electrode.

8. The electronic component according to claim 1, wherein the metal particle aggregate includes metal nanoparticles.

9. The electronic component according to claim 8, wherein a particle size of the metal nanoparticles is about 0.5 nm or greater and about 50 nm or smaller.

10. The electronic component according to claim 1, wherein the metal particle aggregate is an aggregate of metal particles that are made of at least one of Au and Cu.

11. The electronic component according to claim 1, wherein a porosity of the metal particle aggregate is about 2% or higher and about 20% or lower.

12. The electronic component according to claim 1, wherein the support layer has a frame shape and surrounds the functional electrode.

13. The electronic component according to claim 1, wherein the support layer is made of resin.

14. The electronic component according to claim 1, wherein the cover layer has a thickness of about 50 μm or less.

15. The electronic component according to claim 8, wherein a particle size of the metal nanoparticles is about 1.0 nm or greater and about 50 nm or smaller.

16. The electronic component according to claim 9, wherein a percentage of metal nanoparticles with a particle size of about 0.5 nm or greater and about 50 nm or smaller in the metal particle aggregate is about 80% or higher.

17. The electronic component according to claim 5, wherein the element substrate has a rectangular or substantially rectangular plate shape.

18. The electronic component according to claim 5, further comprising a sealing resin layer that is disposed on a cover layer and covers the element substrate.

19. The electronic component according to claim 18, wherein the sealing resin layer, the element substrate, and the cover layer define another second hollow space that the another functional electrode faces.

\* \* \* \* \*